United States Patent
Nakaya et al.

(10) Patent No.: US 8,723,258 B2
(45) Date of Patent: May 13, 2014

(54) ELECTROSTATIC DISCHARGE (ESD) TOLERANCE FOR A LATERAL DOUBLE DIFFUSION METAL OXIDE SEMICONDUCTOR (LDMOS) TRANSISTOR

(75) Inventors: Kiyofumi Nakaya, Konosu (JP); Tetsuro Hirano, Oizumi-machi (JP); Shuji Fujiwara, Hashima (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 363 days.

(21) Appl. No.: 13/229,201

(22) Filed: Sep. 9, 2011

(65) Prior Publication Data
US 2012/0061757 A1 Mar. 15, 2012

(30) Foreign Application Priority Data
Sep. 9, 2010 (JP) ................. 2010-201584

(51) Int. Cl.
*H01L 29/66* (2006.01)
*H01L 29/06* (2006.01)
*H01L 29/78* (2006.01)
*H01L 29/08* (2006.01)

(52) U.S. Cl.
CPC ........ *H01L 29/0696* (2013.01); *H01L 29/7816* (2013.01); *H01L 29/0856* (2013.01)
USPC ..... 257/339; 257/335; 257/343; 257/E29.256

(58) Field of Classification Search
CPC ............ H01L 29/0696; H01L 29/7816; H01L 29/0856
USPC .......................... 257/339, 335, 343, E29.256
See application file for complete search history.

(56) References Cited

U.S. PATENT DOCUMENTS 7,414,287 B2 * 8/2008 Pendharkar et al. .......... 257/341

FOREIGN PATENT DOCUMENTS

JP 2001-320047 11/2001

* cited by examiner

*Primary Examiner* — Stephen W Smoot
*Assistant Examiner* — Vicki B Booker
(74) *Attorney, Agent, or Firm* — Noon Intellectual Property Law, PC

(57) ABSTRACT

An ESD tolerance of an LDMOS transistor is improved. An N+ type source layer shaped in a ladder and having a plurality of openings in its center is formed in a surface of a P type base layer using a gate electrode and a resist mask. A P+ type contact layer is formed to be buried in the opening. At that time, a distance from an edge of the opening, that is an edge of the P+ type contact layer, to an edge of the N+ type source layer is set to a predetermined distance. The predetermined distance is equal to a distance at which an HBM+ESD tolerance of the LDMOS transistor, which increases as the distance increases, begins to saturate.

17 Claims, 13 Drawing Sheets

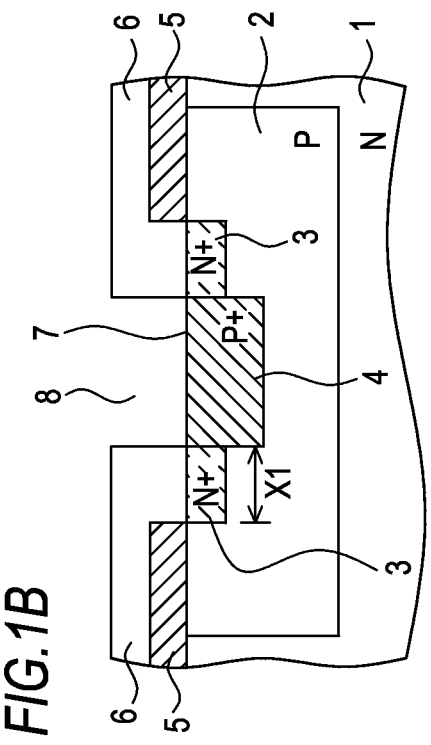
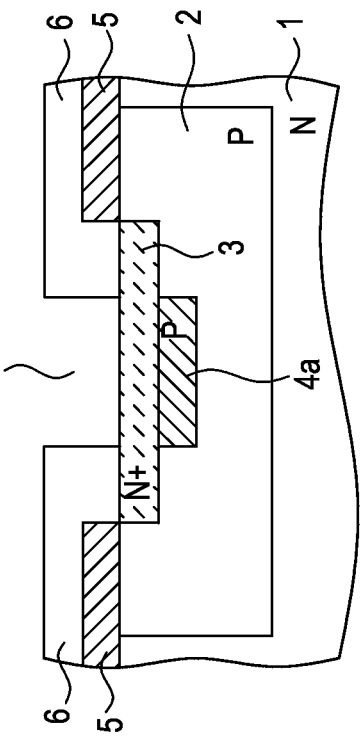
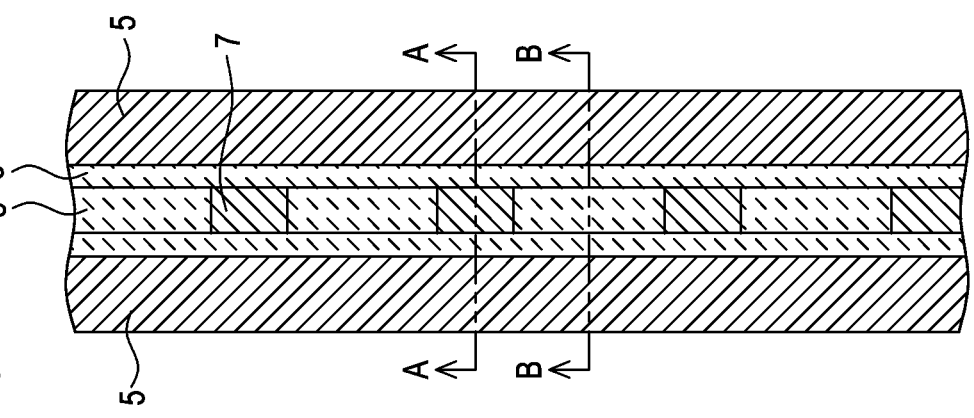

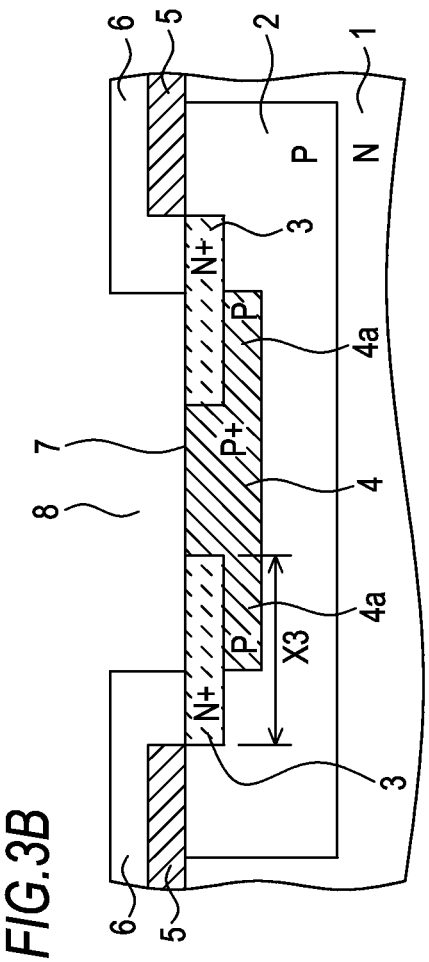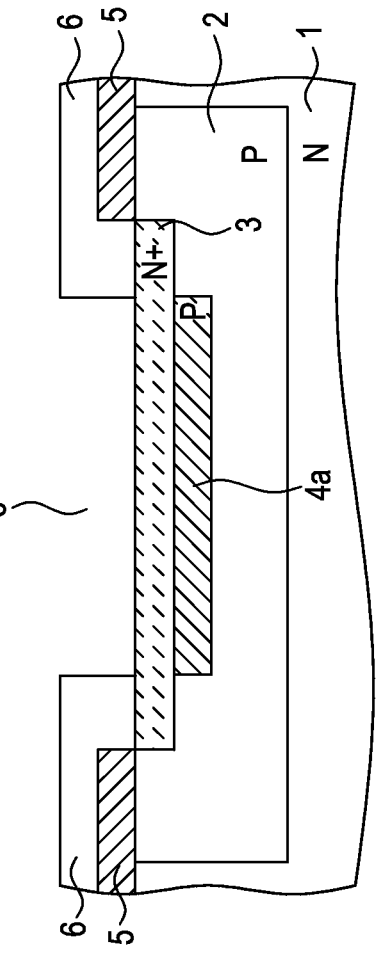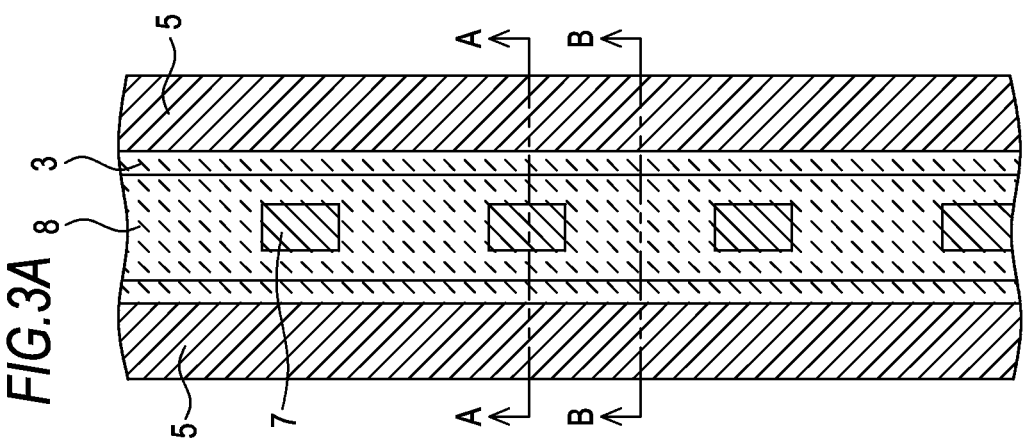

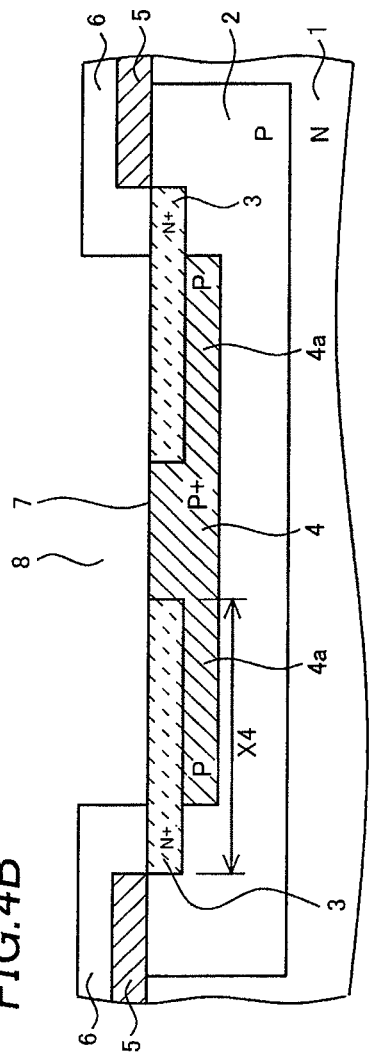
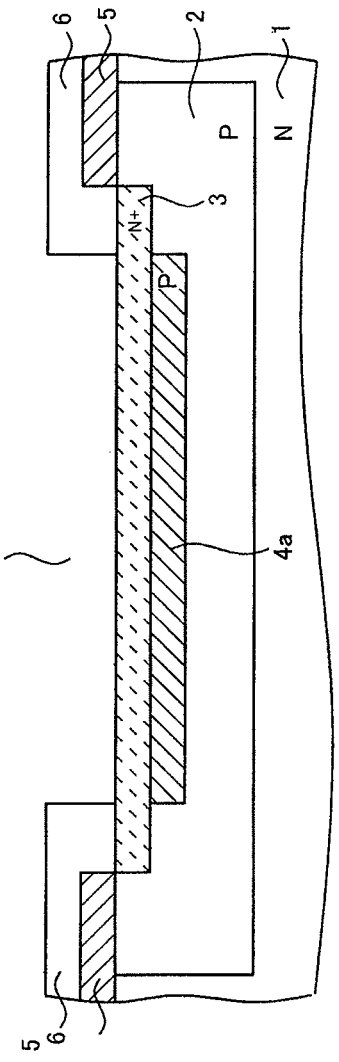
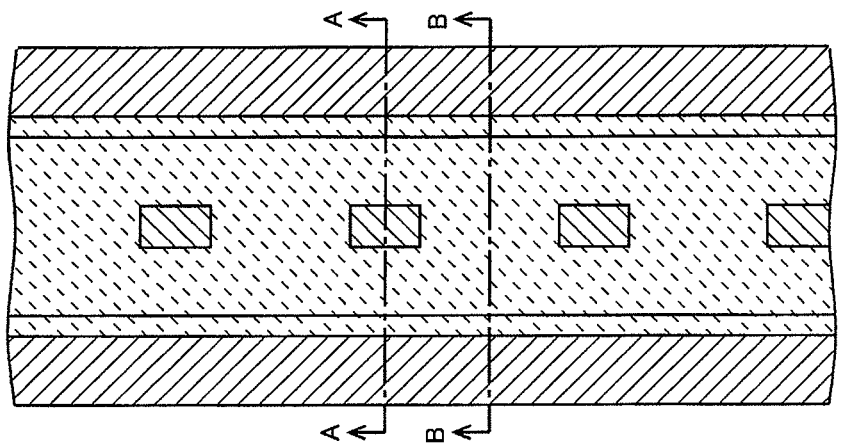

HBM ESD TEST CIRCUIT

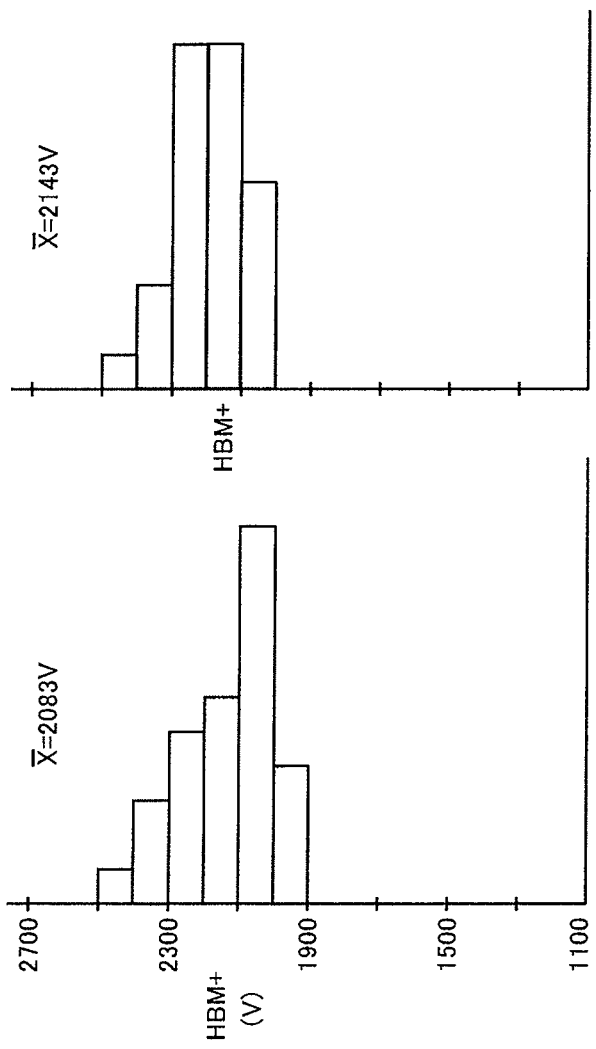

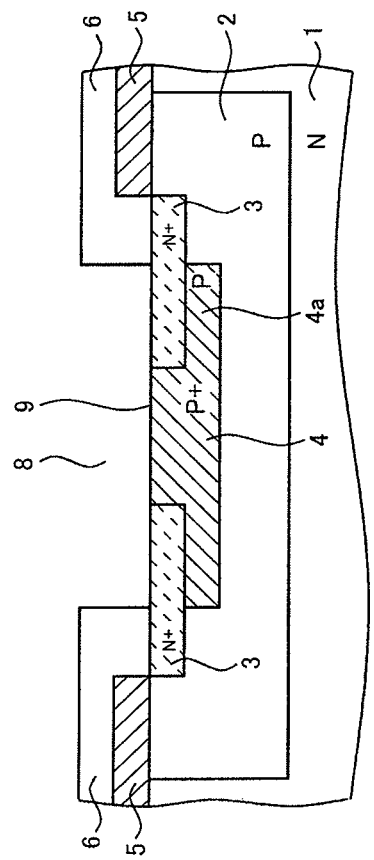
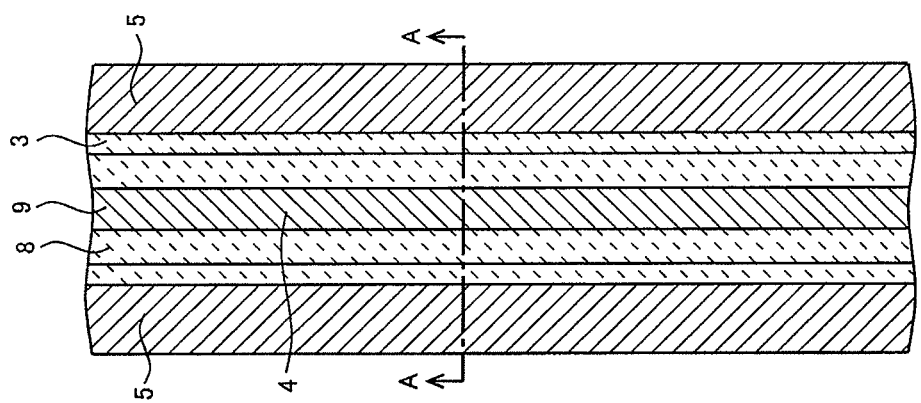
FIG.9A
FIG.9B

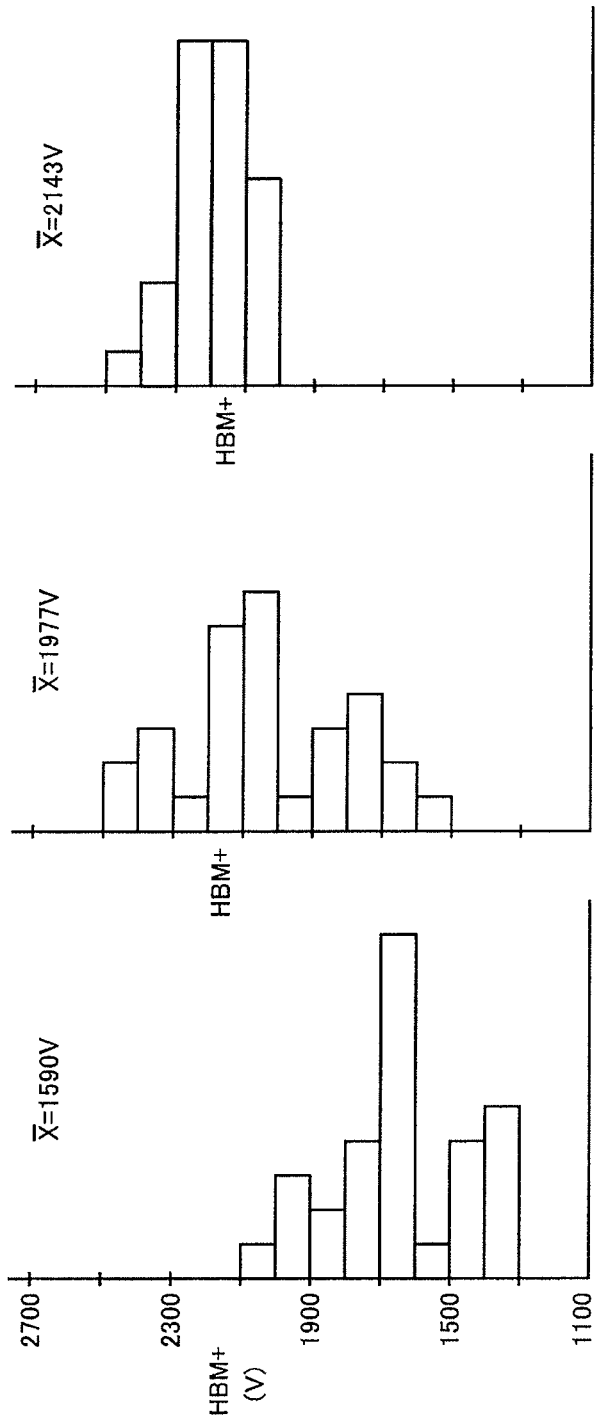

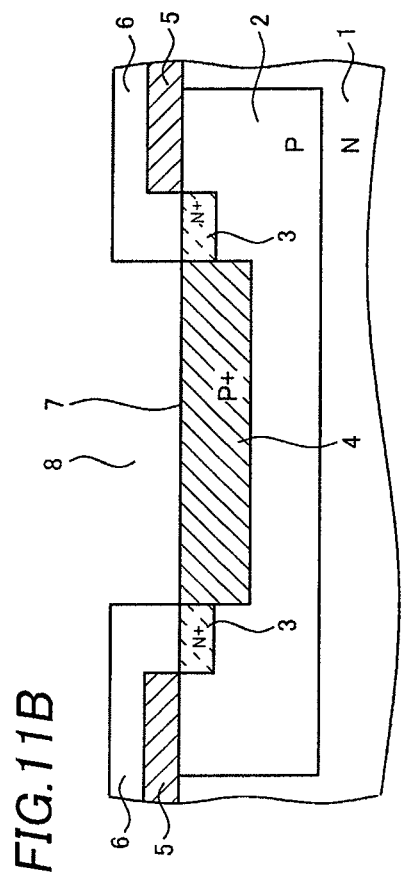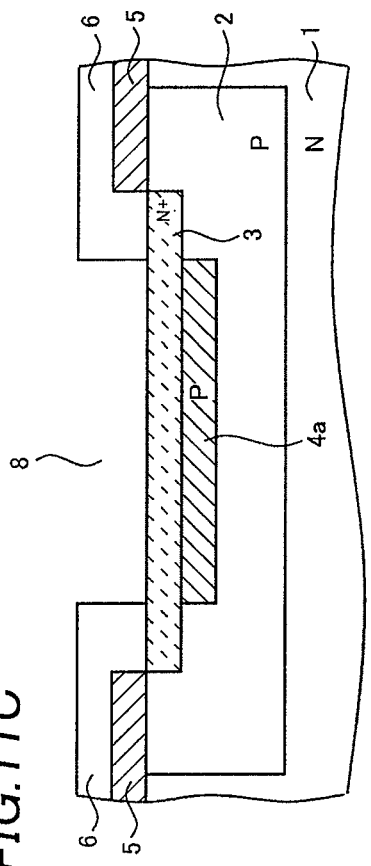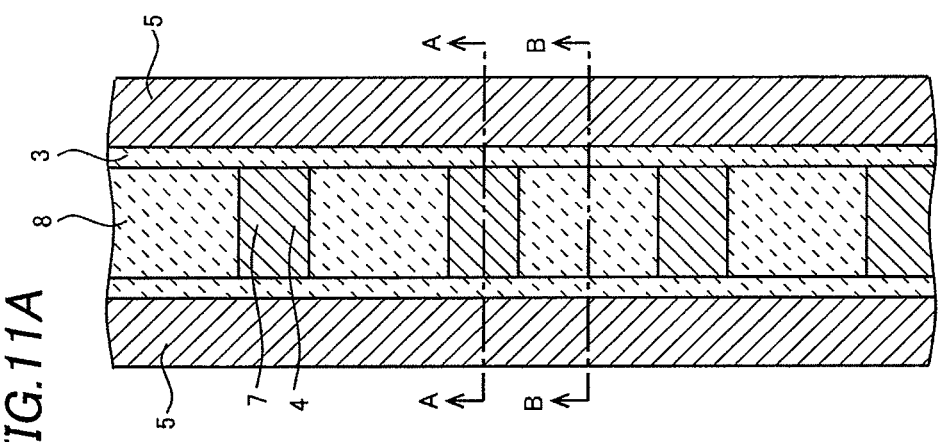

ELECTROSTATIC DISCHARGE (ESD) TOLERANCE FOR A LATERAL DOUBLE DIFFUSION METAL OXIDE SEMICONDUCTOR (LDMOS) TRANSISTOR

CROSS-REFERENCE OF THE INVENTION

This application claims priority from Japanese Patent Application No. 2010-201584, the content of which is incorporated herein by reference in its entirety.

BACKGROUND OF THE INVENTION

1. Field of the Invention

This invention relates to a semiconductor device, specifically to an LDMOS transistor that has an excellent ESD tolerance.

2. Description of the Related Art

The LDMOS transistor, as well as an IGBT, is widely used in a switching power supply such as a DC-DC converter, an inverter circuit of lighting apparatus, an inverter circuit for a motor and the like, because it is excellent in high current drivability, high withstand voltage and switching characteristics, and is easy to use compared with a bipolar type power transistor. The LDMOS is an acronym for Lateral Double Diffusion Metal Oxide Semiconductor. And the ESD is an acronym for Electro-Static Discharge.

A simplified cross-sectional view of the LDMOS transistor is shown in FIG. 12B, for example. The LDMOS transistor shown in FIG. 12B is structured as an N channel MOS transistor. It is composed of an N type semiconductor layer 51, an N− type drift layer 52, an N+ type drain layer 57, a P type base layer 53, an N+ type source layer 56, a P+ type contact layer 58, a gate insulation film 54 and a gate electrode 55. FIG. 12A shows a structure formed by removing the P+ type contact layer 58 from the structure shown in FIG. 12B. Considering the operations of the LDMOS transistor, the structure shown in FIG. 12A having no P+ type contact layer 58 seems to be sufficient.

However, following problem is caused with the LDMOS transistor having no P+ type contact layer 58 as shown in FIG. 12A, when the LDMOS transistor is turned on by applying a positive high voltage +Vd to the N+ type drain layer 57, grounding the N+ type source layer 56, and applying a positive voltage to the gate electrode 55. The problem is that a parasitic NPN transistor, which is composed of an emitter made of the N+ type source layer 56, a base made of the P type base layer 53 and a collector made of the N+ type drain layer 57 and the like, is turned on by the reason to be described below to increase an unnecessary current that can be not controlled by the gate electrode 55, when the LDMOS transistor is turned on and an electron current flows from the N+ type source layer 56 to the N+ type drain layer 57.

When the LDMOS transistor is turned on, electrons flow out of the N+ type source layer 56 into the N− type drift layer 52 through a channel layer, are accelerated by a high electric field in the N− type drift layer 52, and flow into the N+ type drain layer 57. In this case, electrons accelerated in the N− type drift layer 52 are turned into hot electrons having high energy, and interact with lattices and the like in the N− type drift layer 52 to generate a large number of electron-hole pairs. In FIG. 12A, a circled e⁻ represents the hot electron, and e⁻ and e⁺ represent the electron-hole pair generated by the interaction with the hot electron.

While the electrons generated as described above flow into the N+ type drain layer 57, the holes flow toward the N+ type source layer 56 at the ground electric potential. The holes that reached the N+ type source layer 56 are blocked by its potential bather and remain dispersed in the P type base layer 53 around the N+ type source layer 56, so that an electric potential at the P type base layer 53 becomes higher than the electric potential at the N+ type source layer 56.

As a result, the parasitic NPN transistor, which is composed of the emitter made of the N+ type source layer 56, the base made of the P type base layer 53 and the collector made of the N+ type drain layer 57, is turned on and the electron current flows out of the N+ type source layer 56 to the P type base layer 53, since the electric potential at the P type base layer 53 that makes the base layer becomes higher than the electric potential at the N+ type source layer 56 that makes the emitter layer. The electron current that has flown into the P type base layer 53 further flows into the N+ type drain layer 57 at the positive voltage +Vd. As a result, there is caused the problem that the unnecessary current which can be not controlled by the gate electrode 55 is increased.

In the case where the P+ type contact layer 58 is formed in parallel with the N+ type source layer 56 and extending into the P type base layer 53 as shown in FIG. 12B, on the other hand, the structure is impervious to the problem that the parasitic NPN transistor is turned on. The electron-hole pairs are generated in the N− type drain layer 52 by the hot electrons and the electrons flow into the N+ type drain layer 57 as in the case of the structure shown in FIG. 12A. However, there is a difference regarding the holes.

Unlike in the structure shown in FIG. 12A, most of holes flowing toward the N+ type source layer 56 at the ground electric potential flow into the P+ type contact layer 58 formed in parallel with the N+ type source layer 56 and extending into the P type base layer 53. That is because the P+ type contact layer 58 does not make the potential barrier against the holes. Therefore, a difference between the electric potential at the N+ type source layer 56 and the electric potential at the P type base layer 53 adjacent the N+ type source layer 56 is decreased to reduce a possibility that the parasitic NPN transistor described above would be turned on.

However, if the parasitic NPN transistor would be not turned on, a dielectric breakdown between the source and the drain would be caused to destroy the LDMOS transistor when a large positive surge voltage due to an ESD extremely larger than a normal power supply voltage is applied to the N+ type drain layer 57. The problem and its countermeasure in the case where the large positive surge voltage due to the ESD is applied to the N+ type drain layer 57 are disclosed in Japanese Patent Application Publication No. 2001-320047.

When the large positive surge voltage due to the ESD is applied to the N+ type drain layer 57, an avalanche breakdown occurs in the vicinity of the N+ type drain layer 57 under a strong electric field so that a large number of electron-hole pairs are generated. The generated electrons flow into the N+ type drain layer 57, while the generated holes flow into the P type base layer 53.

The electric potential at the P type base layer 53 is raised above the electric potential at the N+ type source layer 56 by the holes that flow into the P type base layer 53. As a result, the parasitic NPN transistor, which is composed of the emitter made of the N+ type source layer 56, the base made of the P type base layer 53 and the collector made of the N+ type drain layer 57 and the like, is turned on.

A voltage between the N+ type source layer 56 and the N+ type drain layer 57 is clamped at a low voltage and the destruction of the device due to the ESD is prevented by the turning on of the parasitic NPN transistor. However, a localized current convergence occurs in the vicinity of the N+ type drain layer 57 to cause a thermal runaway in this region.

Thus, sufficient ESD tolerance is not obtained and there is caused a problem in extreme cases that the vicinity of the N+ type drain layer 57 is destroyed. There is disclosed that an LDMOS transistor with an improved ESD tolerance is realized by forming a P+ type anode layer (not shown) adjacent the N+ type drain layer 57.

In the same Japanese publication, the insufficient ESD tolerance is attributed to the thermal runaway due to the localized convergence of the avalanche current in the vicinity of the N+ type drain layer 57, and its countermeasure is modification in the drain-side structure. It is taken for granted that the parasitic NPN transistor is turned on. However, the P+ type contact layer 58 also serves to prevent the parasitic NPN transistor from turning on.

Therefore, it is necessary that the parasitic transistor is turned on when the abnormally large surge voltage is applied, while the parasitic NPN transistor is prevented from turning on in the normal operation. The inventors investigated how the P+ type contact layer 58 and the N+ type source layer 56 should be structured to meet the requirements described above.

SUMMARY OF THE INVENTION

The invention provides a semiconductor transistor that includes a semiconductor layer of a first general conductivity type, a drift layer of the first general conductivity type formed in a surface portion of the semiconductor layer, a drain layer of the first general conductivity type formed in a surface portion of the drift layer, a base layer of a second general conductivity type formed in a surface portion of the semiconductor layer apart from the drift layer, a source layer of the first general conductivity type formed in a surface portion of the base layer and comprising a plurality of openings, a contact layer of the second general conductivity type filling each of the openings in the source layer so that there is a distance between an edge of the contact layer and a corresponding edge of the source layer, a gate insulation film covering at least part of the base layer and part of the semiconductor layer, and a gate electrode disposed on the gate insulation film. The distance is larger than or equal to a distance between the edge of the contact layer and the corresponding edge of the source layer at which an ESD tolerance of the transistor begins to saturate.

BRIEF DESCRIPTION OF THE DRAWINGS

FIG. 1A is a plan view showing a source region of a semiconductor device according to a reference example.

FIG. 1B is a cross-sectional view showing a section A-A in FIG. 1A.

FIG. 1C is a cross-sectional view showing a section B-B in FIG. 1A.

FIG. 3A is a plan view showing a source region of a semiconductor device according to an embodiment of this invention.

FIG. 3B is a cross-sectional view showing a section A-A in FIG. 3A.

FIG. 3C is a cross-sectional view showing a section B-B in FIG. 3A.

FIG. 4A is a plan view showing a source region of a semiconductor device according to a reference example.

FIG. 4B is a cross-sectional view showing a section A-A in FIG. 4A.

FIG. 4C is a cross-sectional view showing a section B-B in FIG. 4A.

FIGS. 7A and 7B show HBM+ESD tolerance distributions showing a difference in the HBM+ESD tolerance due to a difference in a width of a contact groove for forming a P+ type contact layer in an opening in an N+ type source layer.

FIG. 9A is a plan view showing a semiconductor device according to a reference example having an opening groove in a center of the N+ type source layer.

FIG. 9B is a cross-sectional view showing a section A-A in FIG. 9A.

FIGS. 10A, 10B and 10C show HBM+ESD tolerance distributions comparing the semiconductor device according to the embodiment of this invention with the semiconductor devices according to the reference examples.

FIG. 11A is a plan view showing a source region of a semiconductor device according to a reference example.

FIG. 11B is a cross-sectional view showing a section A-A in FIG. 11A.

FIG. 11C is a cross-sectional view showing a section B-B in FIG. 11A.

DETAILED DESCRIPTION OF THE INVENTION

Figure 13A:
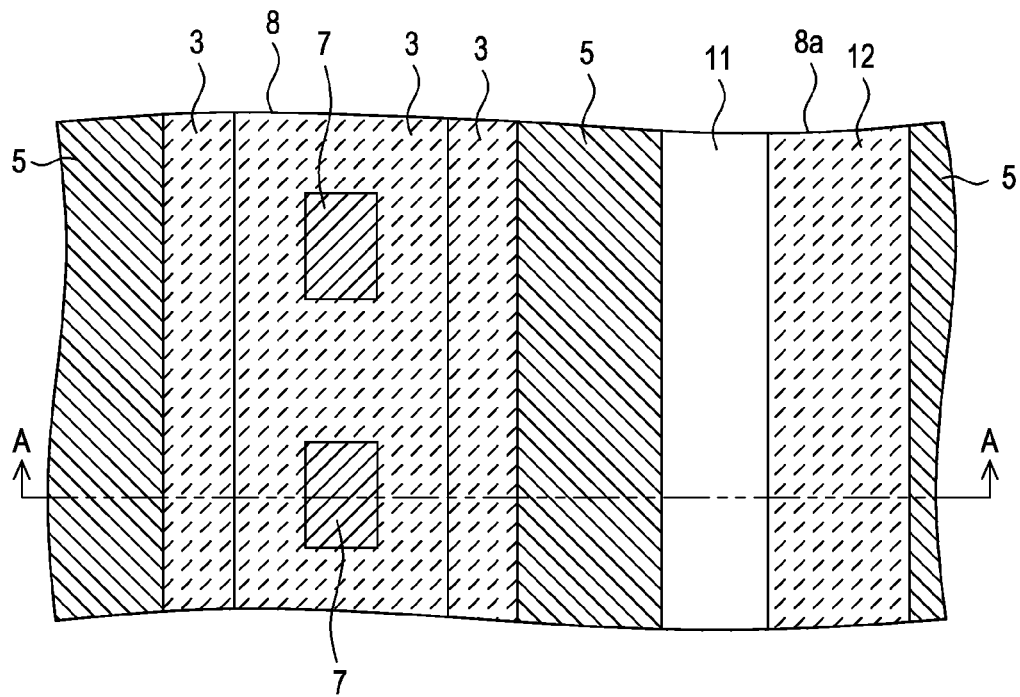
FIGS. 13A and 13B show a transistor structure in which the structure shown in FIGS. 3A-3C is included.
Figure 13B:
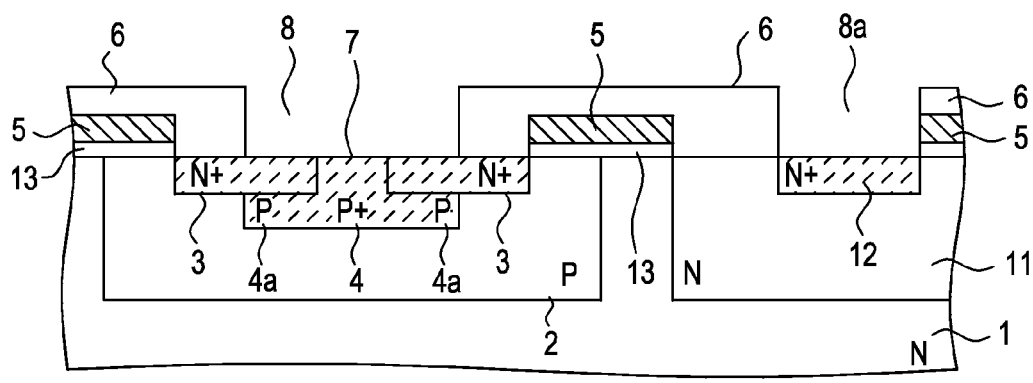

LDMOS transistors according to embodiments of this invention will be explained referring to FIG. 1A-FIG. 11C. In one of preferable embodiments, the transistor has the structure shown in FIGS. 3A, 3B and 3C, wherein a distance X3 shown in FIG. 3B is around 1.5 µm. This invention relates to increasing an area of an N+ type source layer 3, which is shaped in a ladder having a plurality of evenly spaced openings 7 in its center. Specifically, this invention relates to a correlation between a distance X from an edge of the opening 7, in which a P+ type contact layer 4 is buried, to an edge of the N+ type source layer 3 and an HBM ESD tolerance that increases and eventually saturates as the distance X increases. Therefore, a drain region is omitted from the drawings, and the explanation is given referring to simplified drawings in which a source region is represented by a single N+ type source layer 3. The N+ type source layer 3 is formed in a P type base layer 2. Gate electrode 5 is extended outward from an end portion of the N+ type source layer 3 on the P type base layer 2. It is noted that conductivity types such as N+, N and N− belong in one general conductivity type and conductivity types such as P+, P and P− belong in the other general conductivity type. FIG. 13A is a schematic plan view showing the LDMOS transistor according to the embodiment of this invention. FIG. 13B is a cross-sectional view showing a section A-A in FIG. 13A. FIG. 13B shows drift layer 11, drain layer 12, gate insulation film 13, N type epitaxial layer 1, interlayer insulation layer 6, P type layer 4a, contact groove 8 and contact groove 8a.

The distance X from the edge of the opening 7 in the N+ type source layer 3 to the edge of the N+ type source layer 3 is increased from X1 to X4 in structures shown in FIGS. 1B, 2B, 3B and 4B. FIG. 1B shows the structure in which the distance X from the edge of the opening 7 in the N+ type source layer 3 to the edge of the N+ type source layer 3 is X1, that is 0.6 μm to be more specific. A width of the opening 7 in the N+ type source layer 3 shown in FIG. 1B is 1.2 μm, which is common to the structures shown in FIG. 1B, FIG. 2B, FIG. 3B and FIG. 4B.

FIG. 1A is a plan view showing a source region of a semiconductor device according to a reference example. FIG. 1B is a cross-sectional view showing a section A-A in FIG. 1A, which includes the opening 7 in the N+ type source layer 3. Boron ions or the like are implanted into the opening 7 through a contact groove 8 formed in an interlayer insulation film 6 to form the P+ type contact layer 4. FIG. 1C is a cross-sectional view showing a section B-B in FIG. 1A. A portion of the N+ type source layer 3 is exposed in the contact groove 8. A P type layer 4a that is contiguous to the P+ type contact layer 4 formed in the opening 7 is formed under the exposed portion of the N+ source layer 3.

Figure 2B:
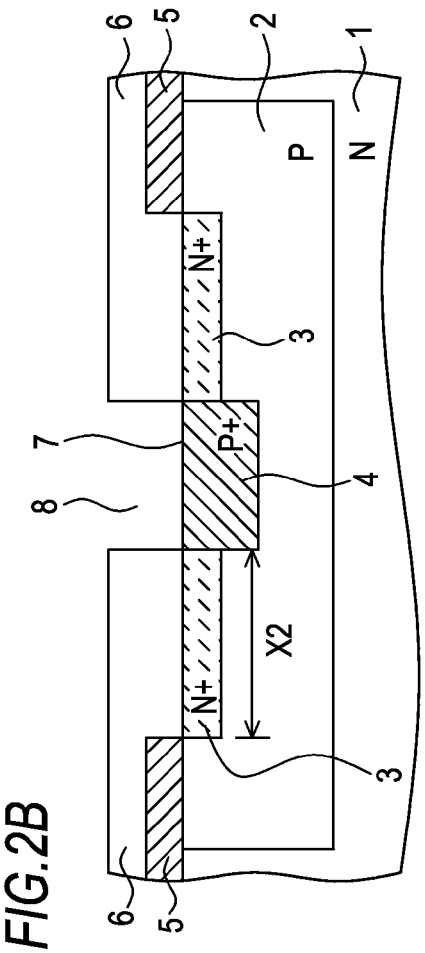
FIG. 2B is a cross-sectional view showing a section A-A in FIG. 2A.
Figure 2C:
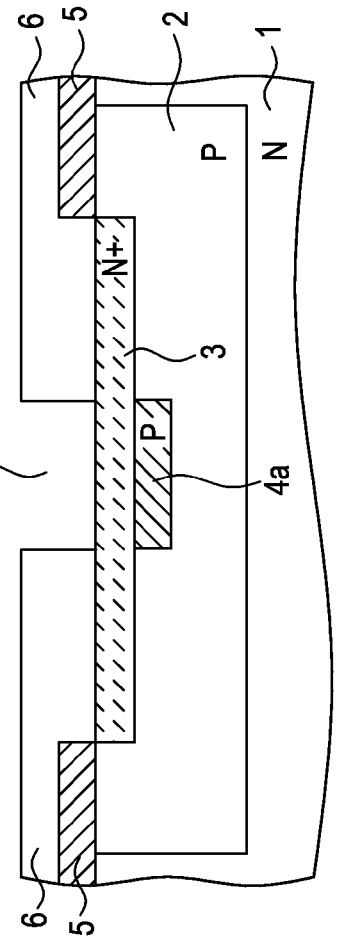
FIG. 2C is a cross-sectional view showing a section B-B in FIG. 2A.
Figure 2A:
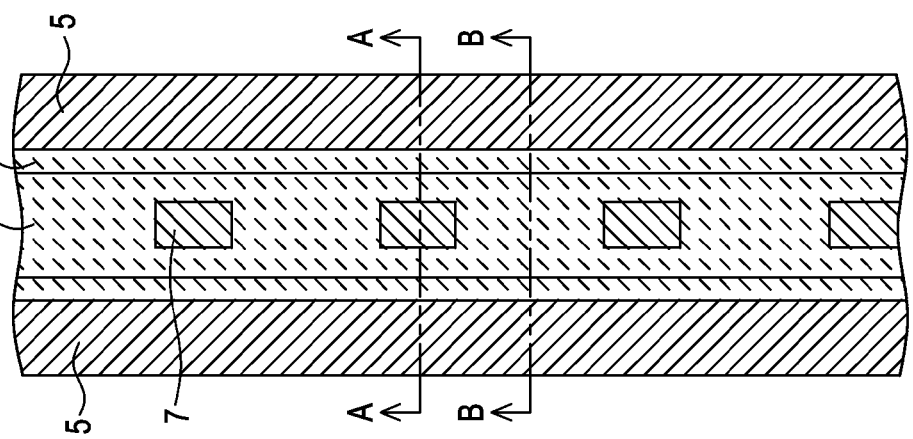
FIG. 2A is a plan view showing a source region of a semiconductor device according to a reference example.

FIG. 2B shows the structure in which the distance X from the edge of the opening 7 in the N+ type source layer 3 to the edge of the N+ type source layer 3 is X2, that is 1.6 μm to be more specific. Other dimensions including the width of the contact groove 8 are the same as those in the structure shown in FIG. 1B. Since a total width of the N+ type source layer 3 in the structure shown in FIG. 2B is larger by 2 μm than that in the structure shown in FIG. 1B, a current flows more easily in the structure shown in FIG. 2B.

In the structure shown in FIG. 3B, the width of the contact groove 8 formed in the interlayer insulation film 6 is larger than the width of the opening 7 in the N+ type source layer 3 as shown in FIG. 3B, while the distance X3 from the edge of the opening 7 in the N+ type source layer 3 to the edge of the N+ type source layer 3 is 1.6 μm, that is the same as the distance X2 in the structure shown in FIG. 2B.

On the other hand, the structure shown in FIG. 3B is similar to the structure shown in FIG. 1B in that a distance from an edge of the contact groove 8 to the edge of the N+ source layer 3 is 0.6 μm at each of both edges of the contact groove 8.

However, the distance X3 from the edge of the opening 7 in the N+ type source layer 3 to the edge of the N+ type source layer 3 is 1.6 μm, which is the same as the distance X2 in the structure shown in FIG. 2B. Since the width of the opening 7 in the N+type source layer 3 and the width of the contact groove 8 are equal to each other in the structure shown in FIG. 2B, the opening 7 in the N+ type source layer 3 is not always completely filled with the P+ type contact layer 4 due to a misalignment of masks used in photolithography. As a result, there may be caused variation in capability to absorb the holes. In the structure shown in FIG. 3B, on the other hand, the width of the contact groove 8, which also serves as a mask in forming the P+ type contact layer 4, is larger than the width of the opening 7 in the N+ type source layer 3. Therefore, the opening 7 in the N+ type source layer 3 is completely filled with the P+ type contact layer 4 by implanting boron ions or the like through the contact groove 8. In this case, the boron ions or the like are also implanted into a region under the portion of the N+ type source layer 3 exposed in the contact groove 8 to form the P type layer 4a that is contiguous to the P+ type contact layer 4.

FIG. 4B shows the structure in which the distance X from the edge of the opening 7 in the N+ type source layer 3 to the edge of the N+ type source layer 3 is X4, that is 2.6 μm to be more specific. The structure shown in FIG. 4B is the same as the structure shown in FIG. 3B in that the contact groove 8 larger than the opening 7 in the N+ type source layer 3 is formed in the interlayer insulation film 6 so as to expose the N+ type source layer 3 except for an edge region of 0.6 μm at each of both edges.

Next, HBM+ESD tolerances are compared to show how the ESD tolerance of the LDMOS transistor is improved as the distance X from the edge of the opening 7 in the N+ type source layer 3 to the edge of the N+ type source layer 3 is increased, as shown in FIG. 1B-FIG. 4B. The ESD is regarded as a pulse of high energy discharged when a human body or a material body charged with electrostatic charge touches a semiconductor device.

Figure 5:
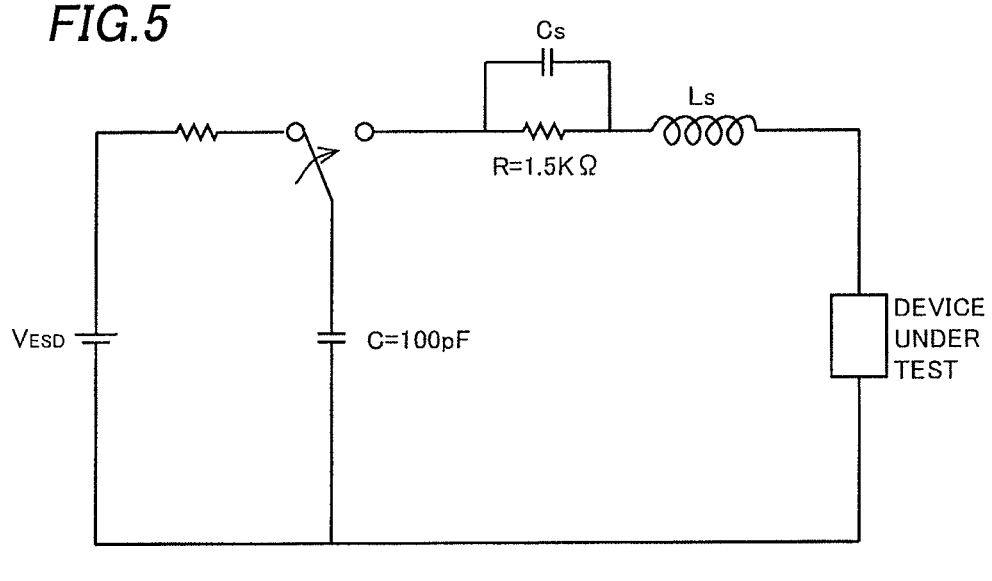
FIG. 5 is a circuit diagram of an HBM ESD tolerance test circuit.

Although there are the HBM (Human Body Model) ESD tolerance and an MM (Machine Model) ESD tolerance as measures to compare the ESD tolerances, the HBM ESD tolerance is used in general. The HBM ESD tolerance is measured with a test circuit shown in FIG. 5, assuming that the human body is a charged body having a capacitance C=100 pF and a resistance R=1.5 kΩ. That is, after a capacitor C of 100 pF is charge by applying a voltage $V_{ESD}$, a switch is turned to the right to discharge the stored charge through a resistor R of 1.5 kΩ as a pulse of the voltage $V_{ESD}$, which is applied to a device under test, as shown in FIG. 5.

HBM+ESD tolerances of the LDMOS transistors each having the structure shown in each of FIGS. 1B, 2B, 3B and 4B, respectively, are measured with the test circuit described above and are shown in FIGS. 6A, 6B, 6C, 7A and 7B. The HBM+ESD tolerance is a breakdown tolerance of the LDMOS transistor when a large positive ESD pulse is applied to an N+ type drain layer (not shown) of the LDMOS transistor.

Figure 6A:
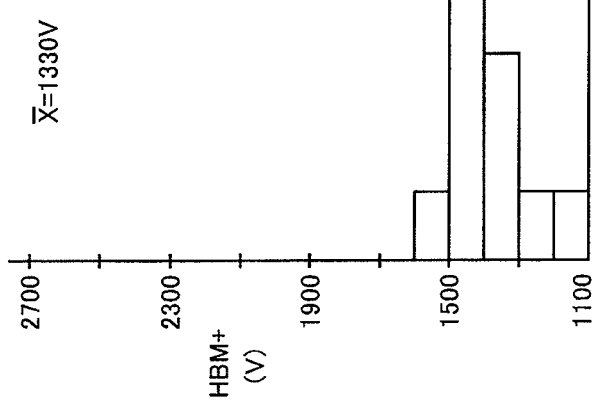
FIGS. 6A, 6B and 6C show HBM+ESD tolerance distributions comparing the semiconductor device according to the embodiment of this invention with the semiconductor devices according to the reference examples.
Figure 6B:
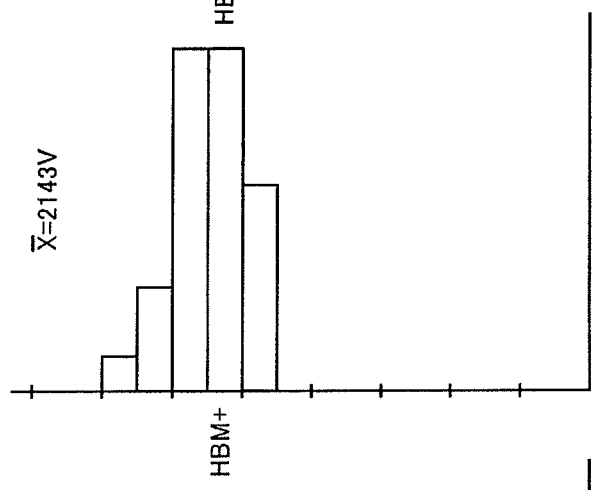
Figure 6C:
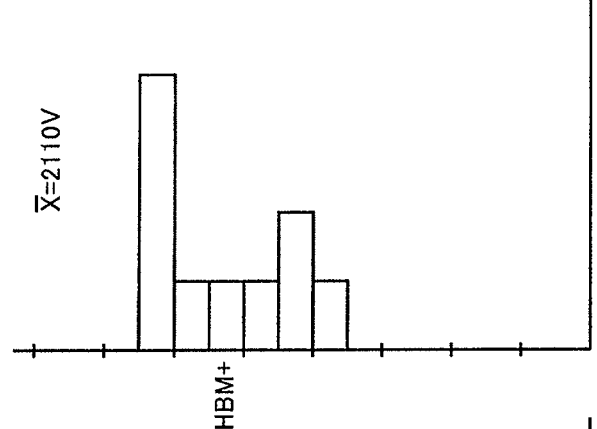

FIGS. 6A, 6B and 6C show distributions of the HBM+ESD tolerances corresponding to the structures shown in FIG. 1B, FIG. 3B and FIG. 4B, in which the distance X from the edge of the opening 7 in the N+ type source layer 3 to the edge of the N+ type source layer 3 is varied. FIG. 6A shows a distribution of the HBM+ESD tolerances of the structure shown in FIG. 1B, in which the distance X from the edge of the opening 7 in the N+ type source layer 3 to the edge of the N+ type source layer 3 is 0.6 μm. An average value of the distribution is as low as 1,330V.

On the other hand, FIG. 6B shows a distribution of the HBM+ESD tolerances of the structure shown in FIG. 3B, in which the distance X from the edge of the opening 7 in the N+ type source layer 3 to the edge of the N+ type source layer 3 is 1.6 μm. The average value of the distribution is improved to 2,143V. While FIG. 6B corresponds to the structure shown in FIG. 3B, FIGS. 7A and 7B show comparison between the HBM+ESD tolerances of the structures shown in FIGS. 2B and 3B.

FIG. 7B and FIG. 6B correspond to the same sample that has the structure shown in FIG. 3B. FIG. 7A corresponds to the structure shown in FIG. 2B. Although there is a difference of about 60V between the two distributions, it is within a range of variations and the HBM+ESD tolerances of the both structures are regarded as approximately equal to each other.

FIG. 6C shows a distribution of the HBM+ESD tolerances of the structure shown in FIG. 4B, in which the distance X from the edge of the opening 7 in the N+ type source layer 3 to the edge of the N+ type source layer 3 is 2.6 μm. Although the distribution shown in FIG. 6C is about 30V lower than the distribution shown in FIG. 6B, the difference is considered to be within a range of variations.

From the HBM+ESD tolerances shown in FIG. 6A-FIG. 6C, it appears that the HBM+ESD tolerance does not keep increasing but becomes saturated to a predetermined level when the distance X from the edge of the opening 7 in the N+ type source layer 3 to the edge of the N+ type source layer 3 is increased beyond a predetermined distance.

Figure 8:
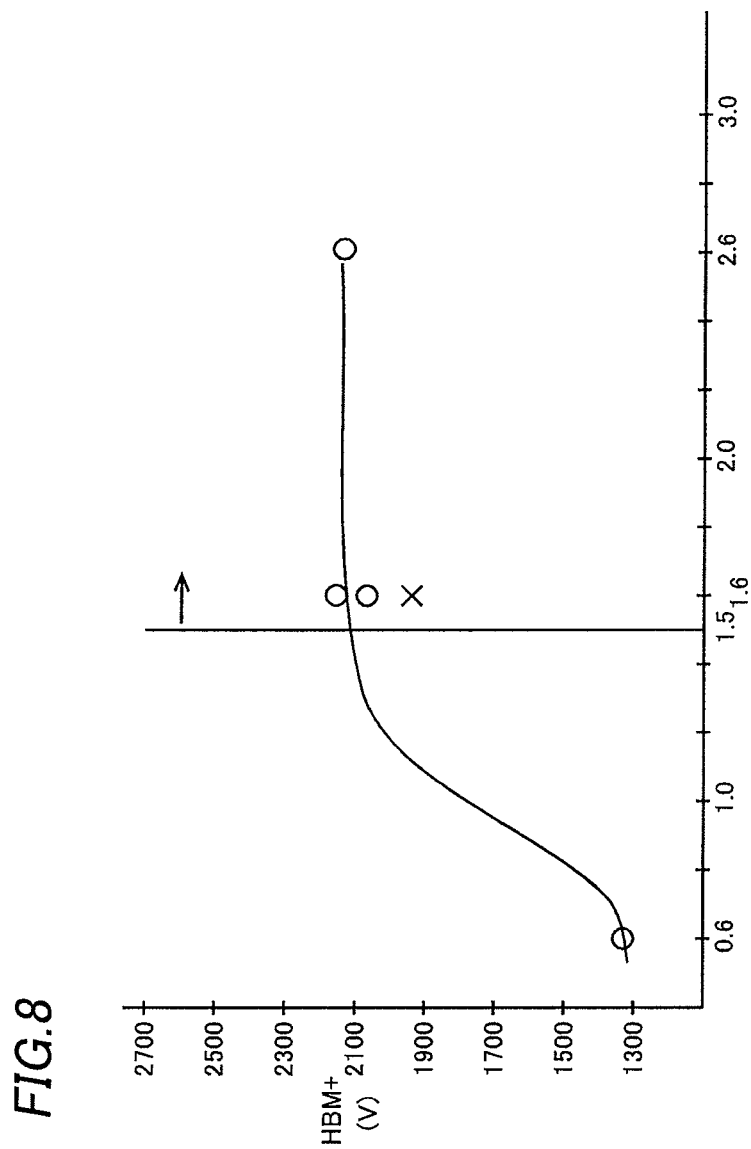
FIG. 8 shows a correlation between a distance from an edge of the opening in the N+ type source layer to an edge of the N+ type source layer and the HBM+ESD tolerance.
Figure 12A:
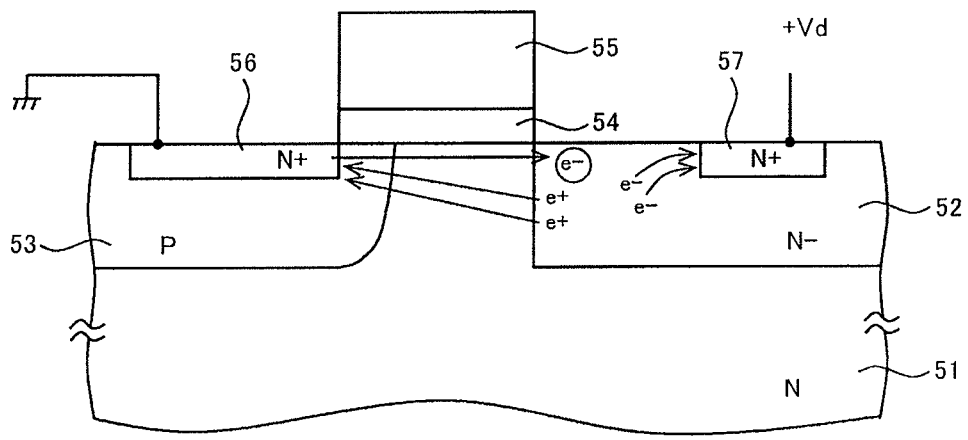
FIG. 12A is a cross-sectional view to explain a turning-on operation of a parasitic NPN transistor in the case where there is no P+ type contact layer in a high tolerance voltage LDMOS transistor.
Figure 12B:
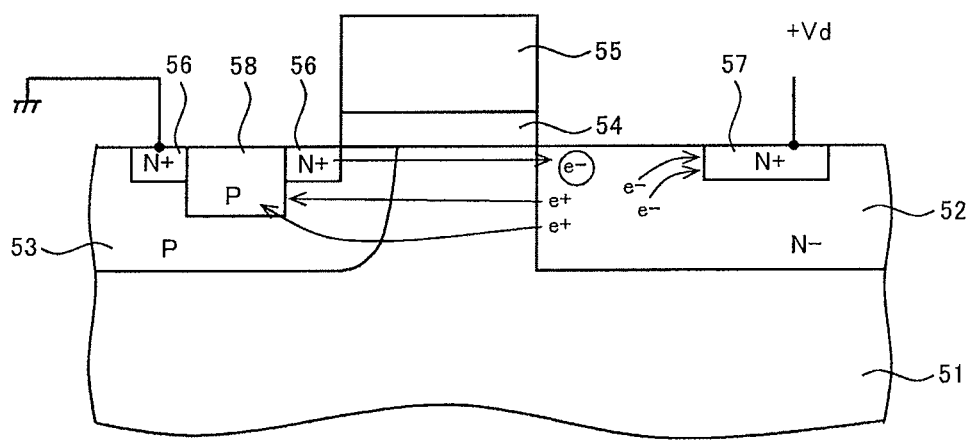
FIG. 12B is a cross-sectional view to explain the turning-on operation of the parasitic NPN transistor in the case where there is a P+ type contact layer in the high tolerance voltage LDMOS transistor.

FIG. 8 shows a correlation between the HBM+ESD tolerance represented by the vertical axis and the distance X from the edge of the opening 7 in the N+ type source layer 3 to the edge of the N+ type source layer 3 represented by the horizontal axis, which is derived from the data shown in FIG. 6A-FIG. 6C, FIG. 7A and FIG. 7B. It is understood from FIG. 8 that the LDMOS transistor according to the embodiment of this invention having the maximum HBM+ESD tolerance of about 2,100V can be realized by designing so that the distance X from the edge of the opening 7 in the N+ type source layer 3 to the edge of the N+ type source layer 3 is around 1.5 μm.

A mark X at a location where the distance X is 1.6 μm in FIG. 8 represents the average HBM+ESD tolerance of a structure formed by modifying the plurality of openings 7 in the N+ type source layer 3 in the structure shown in FIG. 3A into a single stripe of opening groove 9 as shown in FIG. 9A. A distribution of the HBM+ESD tolerances in this case is shown in FIG. 10B. Compared with the distribution of the HBM+ESD tolerances shown in FIG. 10C, which corresponds to the structure shown in FIG. 3B, FIG. 10B shows that the HBM+ESD tolerances are distributed to lower side and disadvantageous, although its average value of about 2,000V is reasonably good.

FIG. 11B shows a structure of an LDMOS transistor that differs from the structure shown in FIG. 3B in that the opening 7 is enlarged to have the same width as the contact groove 8. The distance X from the edge of the opening 7 in the N+ type source layer 3, in which the P+ type contact layer 4 is formed, to the edge of the N+ type source layer 3 is reduced to 0.6 μm which is the same as that in the structure shown in FIG. 1B. As a result, the HBM+ESD tolerance becomes lower than the average value of the HBM+ESD tolerances shown in FIG. 10C of the structure shown in FIG. 3B by nearly 600V, as shown in FIG. 10A.

The reason why the HBM+ESD tolerance is increased as the distance X from the edge of the opening 7 in the N+ type source layer 3 to the edge of the N+ type source layer 3 is increased will be explained below Increasing the distance X as shown in FIG. 3B or the like compared with that in FIG. 1B means increasing an area of the source and allowing the current flow more easily through the source layer 3 in the structure shown in FIG. 3B or the like than in the structure shown in FIG. 1B. When the distance X is increased, a large amount of holes that are generated by an avalanche breakdown caused by an abnormally high surge voltage due to the HBM+ESD and gathered around the N+ type source layer 3 may not be absorbed instantaneously by the P+ type contact layer 4.

Or, since the large amount of holes flow into the P+ type contact layer 4, there is caused an electric potential gradient in the P type base layer 2 under the N+ type source layer 3, which serves as a path for the holes. Thus, a PN junction formed of the N+ type source layer 3 and the P type base layer 2 is forward biased. As a result, the parasitic NPN transistor, which is composed of the emitter made of the N+ type source layer 3, the base made of the P type base layer 2 and the collector made of the N+ type drain layer, is turned.

Once the parasitic NPN transistor is turned on at a portion of the N+ type source layer 3, the ON state of the parasitic NPN transistor spreads all over the N+ type source layer 3 that is laterally extended to provide a broad current path, so that a large amount of surge current is allowed to flow into the ground line rapidly. As a result, the LDMOS transistor is protected against the surge voltage due to the HBM+ESD. Therefore, it is made possible to secure the high HBM+ESD tolerance.

In the case where the distance X is as short as 0.6 μm as shown in FIG. 1B, on the other hand, the parasitic NPN transistor is not easily turned on because most of the large amount of holes generated by the avalanche breakdown is absorbed instantaneously by the P+ type contact layer 4. Even if the parasitic NPN transistor is turned on at a portion of the N+ type source layer 3, the parasitic NPN transistor never turns on over the entire N+ type source layer 3 since the area of the N+ type source layer 3 is small. Therefore, the HBM+ESD tolerance is compelled to be reduced.

The ON state of the parasitic NPN transistor can be confirmed by a TLP (Transmission Line Pulse) method, in which a pulse voltage of a certain width is applied and a response to it is observed. When the parasitic NPN transistor is turned on at a certain location, the location emits light that can be observed with an emission microscope.

In the case where the distance X is as small as 0.6 μm as shown in FIG. 1B, several spots of light emission are observed at localized locations in the N+ type source layer 3. Their spread is not observed since the area of the N+ type source layer 3 is small. In the case where the distance X is as large as 1.6 μm as shown in FIG. 3B, on the other hand, there are observed fine light-emitting spots uniformly distributed over the entire surface of the N+ type source layer 3.

That is, when the distance X is increased, the localized light-emitting spots observed in the beginning spread all over the N+ type source layer 3 in a short period of time so that the N+ type source layer 3 is turned into an aggregation of fine light-emitting spots. From the observation of the light emission described above, it is confirmed that the parasitic NPN transistor is turned on over a broad area of the N+ type source layer 3.

A difference in the light emission showing the ON state of the parasitic NPN transistor between the case in which the P+ type contact layer 4 is formed in the opening 7 in the N+ type source layer 3 as shown in FIG. 3A and the case in which the P+ type contact layer 4 is formed in the opening groove 9 in the N+ type source layer 3 as shown in FIG. 9A can be confirmed by using the TLP method and the emission microscope. It was confirmed that while the N+ type source layer 3 on both sides of the opening 7 emitted light in the structure as shown in FIG. 3A, the N+ type source layer 3 on only one side of the opening groove 9 emitted light in the structure as shown in FIG. 9A.

It is because the N+ type source layer 3 is divided by the opening groove 9, and even when the parasitic NPN transistor is turned on in a region on the one side of the opening groove 9, the ON state is not easily propagated to the other side of the opening groove 9 in the structure as shown in FIG. 9A. Also, it is because the parasitic NPN transistor is not easily turned on in the structure as shown in FIG. 9A, since the area of the P+ type contact layer 4 is increased by modifying the opening 7 to the opening groove 9 so that the holes are more easily absorbed by the P+ type contact layer 4.

Further investigation was conducted using the TLP method and the emission microscope on the light emission in a structure modified from the structure shown in FIG. 3A so that the openings 7 in the N+ type source layer 3 are separated from each other by varying distances. The investigation revealed that the light emission was strong in a region where the separation between the openings 7 is large and the light emission is weak in a region where the separation between the openings 7 is small. The results of the investigation are related to the variation in the HBM+ESD tolerances. Thus, it was found that the separation between the openings 7 should be uniform.

Setting the uniform separation between the openings 7 so that the light emission at the portion of the separation turns from a non-uniform state to a uniform state is effective to improve the variation in the HBM+ESD tolerances and the like.

As understood from the above explanations, in the LDMOS transistor formed to include the N+type source layer 3 having the opening 7 in its center and the P+ type contact layer 4 buried in the opening 7, the broad current path can be secured by extending the width of the N+ type source layer 3 to increase its area so that the parasitic NPN transistor can be turned on in the broad area of the N+ type source layer 3.

That is, by making a distance from an edge of the P+ type contact layer 4, which is the edge of the opening 7 in the N+ type source layer 4, to the edge of the N+ type source layer 3 equal to or larger than a predetermined length, the parasitic NPN transistor can be turned on in the broad area of the N+ type source layer 3 so as to maximize the HBM+ESD tolerance. The predetermined length is around 1.5 mm in this embodiment as shown in FIG. 8. In general, after the distance X at which the HBM+ESD tolerance becomes saturated is confirmed with a TEG (Test Element Group), the distance from the edge of the opening 7 in the N+ type source layer 3 to the edge of the N+ type source layer 3 in the LDMOS transistor is set equal to the distance X confirmed as described above.

Also, a depth of the P+ type contact layer 4 is formed to be deeper than the N+ type source layer 3 in this embodiment. Therefore, the P type layer 4a is also formed at a location where there is no opening 7 in the N+ type source layer 3, as shown in FIG. 3C. The P type layer 4a is connected with the P+ type contact layer 4 buried in the opening 7 in the N+ type source layer 3, and serves to reduce a difference between an electric potential of the P type base layer 2 at a location shown in FIG. 3C and an electric potential of the P type base layer 2 at a location shown in FIG. 3B.

As a result, a difference between an easiness to put the parasitic NPN transistor at the location shown in FIG. 3B into operation and an easiness to put the parasitic NPN transistor at the location shown in FIG. 3C into operation is reduced and the ON state of the parasitic NPN transistor is more easily spread over the entire region of the N+ type source layer 3 so that the LDMOS transistor is protected from the surge voltage due to the ESD.

Although a difference between a structure of the parasitic NPN transistor formed at the location shown in FIG. 3B and a structure of the parasitic NPN transistor formed at the location shown in FIG. 3C can be eliminated by forming the opening groove as shown in FIG. 9A, there is caused a problem in this case that the parasitic NPN transistors on both sides of the N+ type source layer 3 are not easily turned on because the N+ type source layer 3 is divided into left and right portions.

A manufacturing method of the LDMOS transistor according to the embodiment of this invention will be briefly described referring to FIG. 3B and the like. First, a P type semiconductor substrate (not shown) is provided, and an N+ type buried layer (not shown) is formed in the P type semiconductor substrate. Next, an N type epitaxial layer 1 is formed by a predetermined epitaxial method on the P type semiconductor substrate in which the N+type buried layer has been formed.

Next, a P+ type isolation layer (not shown) extending from a surface of the N type epitaxial layer 1 into the P type semiconductor substrate is formed by a predetermined method, and an device isolation insulation film (not shown) is formed on necessary regions by a predetermined method.

Next, an N type drift layer (not shown) is formed in a region of the N type epitaxial layer 1 isolated by the device isolation insulation film and the like by implanting phosphorus (P) ions or the like by a predetermined ion implantation method or the like.

Next, a gate insulation film (not shown) is formed on the N type epitaxial layer 1 excluding the device isolation insulation film. After that, a gate electrode 5 extending from above the gate insulation film to above the device isolation insulation film is formed of a polysilicon film or the like by a predetermined method.

The P type base layer 2 is formed in a region of the N type epitaxial layer 1, which is adjacent through the device isolation insulation film to the region of the N type epitaxial layer 1 in which the N type drift layer has been formed, by implanting boron ions or the like by an ion implantation method or the like using the gate electrode 5 and a resist film (not shown) as a mask.

Next, the N+ type source layer 3 having the plurality of openings 7 in its center is formed by implanting arsenic (As) ions or the like by a predetermined ion implantation method using the gate electrode 5 and a resist film as a mask.

A feature of this invention is to set the distance from the edge of the opening 7 to the edge of the N+ type source layer 3 equal to the distance that maximizes the HBM+ESD tolerance of the LDMOS transistor. Here, the maximum HBM+ESD tolerance means a saturation value of the HBM+ESD tolerance that increases as the distance from the edge of the opening 7 to the edge of the N+ type source layer 3 increases.

At the same time, the N+ type drain layer (not shown) is formed in the N type drift layer. Next, the interlayer insulation film 6 is formed by a predetermined CVD method or the like to cover the P type semiconductor substrate in which the N+ type source layer 3 and the like are formed. Next, the contact groove 8 or the like is formed in the interlayer insulation film 6 through a predetermined photolithography.

Next, a resist mask CP is formed to cover the contact groove 8 or the like formed on the N+ type drain layer so that the P+ type contact layer 4 is formed in the N+ type source layer 3 by implanting boron (B) ions or the like. After that, the P+ type contact layer 4 is formed by a predetermined ion implanting method. At that time, ion implantation energy is set at an appropriate level so that the P+ type contact layer 4 is formed to be deeper than the N+ type source layer 3.

Next, a metal film made of aluminum or the like is deposited by a predetermined sputtering method or the like over the P type semiconductor substrate in which the contact groove 8 or the like has been formed, and a source electrode (not shown) and the like are formed through a predetermined photolithography. After multi-layer wirings or the like are formed, a passivation film is formed by a predetermined CVD method or the like to complete the LDMOS transistor.

With the semiconductor device according to the embodiment of this invention, the ESD tolerance of the LDMOS transistor and its variation can be substantially improved.

What is claimed is:

1. A semiconductor transistor comprising:
a semiconductor layer of a first general conductivity type;
a drift layer of the first general conductivity type formed in a surface portion of the semiconductor layer;
a drain layer of the first general conductivity type formed in a surface portion of the drift layer;
a base layer of a second general conductivity type formed in a surface portion of the semiconductor layer apart from the drift layer;
a source layer of the first general conductivity type formed in a surface portion of the base layer and comprising a plurality of openings;
a contact layer of the second general conductivity type filling each of the openings in the source layer so that there is a distance between an edge of the contact layer and a corresponding edge of the source layer;
a gate insulation film covering at least part of the base layer and part of the semiconductor layer;
a gate electrode disposed on the gate insulation film; and
another semiconductor layer of the second general conductivity type contiguous to the contact layer and extending from the edge of the contact layer into the base layer under the source layer around the opening, wherein an extended portion of the another semiconductor layer is connected with another extended portion of the another semiconductor layer extending from an edge of another contact layer.

2. The semiconductor device of claim 1, wherein the openings are disposed at a regular interval.

3. The semiconductor device of claim 1, wherein the distance between the edge of the contact layer and the corresponding edge of the source layer is a distance at which the ESD tolerance of the transistor starts to be saturated.

4. The semiconductor device of claim 3, wherein the distance between the edge of the contact layer and the corresponding edge of the source layer is at least about 1.5 µm.

5. The semiconductor device of claim 1, wherein the first general conductivity type is a N-type conductivity and the second general conductivity type is a P-type conductivity.

6. The semiconductor device of claim 1, wherein the distance between the edge of the contact layer and the corresponding edge of the source layer is configured so that an ESD tolerance of the transistor as a function of the distance is saturated.

7. The semiconductor device of claim 6, wherein the distance between the edge of the contact layer and the corresponding edge of the source layer is about 1.5 µm.

8. The semiconductor device of claim 1, wherein the distance between the edge of the contact layer and the corresponding edge of the source layer is at least about 1.5 µm.

9. The semiconductor device of claim 1, wherein the distance between the edge of the contact layer and the corresponding edge of the source layer is about 1.5 µm.

10. The semiconductor device of claim 1, wherein the distance between the edge of the contact layer and the corresponding edge of the source layer is about 1.5 µm to about 2.6 µm.

11. The semiconductor device of claim 10, wherein the first general conductivity type is an N-type conductivity, and the second general conductivity type is a P-type conductivity.

12. The semiconductor device of claim 1, further comprising an interlayer insulation film that covers the gate electrode and at least a portion of the source layer.

13. The semiconductor device of claim 12, wherein the interlayer insulation film comprises a contact groove formed over the openings in the source layer.

14. The semiconductor device of claim 13, wherein a width of the contact groove is about the same as a width of the openings in the source layer.

15. The semiconductor device of claim 13, wherein a width of the contact groove is greater than a width of the openings in the source layer.

16. The semiconductor device of claim 13, wherein a width of the contact groove is about the same as a width of the another semiconductor layer.

17. The semiconductor device of claim 13, wherein the interlayer insulation film comprises a second contact groove formed over the drain layer.

* * * * *